(12) United States Patent
Boecker et al.

(10) Patent No.: US 11,688,333 B1
(45) Date of Patent: Jun. 27, 2023

(54) MICRO-LED DISPLAY

(71) Applicant: Microsoft Technology Licensing, LLC, Redmond, WA (US)

(72) Inventors: Charles Walter Boecker, Ames, IA (US); Niranjan Achugundla Puttaswamy, San Jose, CA (US); Barry Thompson, Menlo Park, CA (US); Sheethal Somesh Nayak, San Francisco, CA (US); Jeffrey Neil Margolis, Seattle, WA (US); Chuan Pu, Foster City, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/646,660

(22) Filed: Dec. 30, 2021

(51) Int. Cl.
G09G 3/32 (2016.01)
G09G 3/20 (2006.01)

(52) U.S. Cl.
CPC ............. *G09G 3/32* (2013.01); *G09G 3/2022* (2013.01); *G09G 3/2085* (2013.01); *G09G 2300/0857* (2013.01); *G09G 2320/0233* (2013.01)

(58) Field of Classification Search
CPC ...... G09G 3/32; G09G 3/2022; G09G 3/2085; G09G 2300/0857; G09G 2320/0233; H01L 25/162; H01L 25/167; G11C 11/419
See application file for complete search history.

(56) References Cited

U.S. PATENT DOCUMENTS

| | | | | |
|---|---|---|---|---|
| 10,832,609 B2 * | 11/2020 | Rotzoll | ................ | G09G 3/2007 |
| 11,070,778 B2 * | 7/2021 | Seiler | ........................ | G09G 5/14 |
| 11,238,782 B2 * | 2/2022 | Hudson | .................. | G11C 11/412 |
| 11,257,407 B2 * | 2/2022 | Pappas | ............... | G01R 31/2635 |
| 2004/0150592 A1 | 8/2004 | Mizukoshi et al. | | |
| 2009/0122090 A1 | 5/2009 | Jo et al. | | |
| 2016/0127771 A1* | 5/2016 | Pasqualino | ............ | H04N 19/65 348/474 |

(Continued)

FOREIGN PATENT DOCUMENTS

| | | |
|---|---|---|
| EP | 2661153 B1 | 11/2019 |
| WO | 2019080206 A1 | 5/2019 |

OTHER PUBLICATIONS

Mertens, Ron, "Measuring and Correcting MicroLED Display Uniformity", Retrieved from: https://web.archive.org/web/20210304194305/https://www.oled-info.com/measuring-and-correcting-microled-display-uniformity, Feb. 17, 2021, 12 Pages.

(Continued)

*Primary Examiner* — Michael J Jansen, II
(74) *Attorney, Agent, or Firm* — Alleman Hall Creasman & Tuttle LLP

(57) ABSTRACT

A display device includes a display substrate and a backplane substrate. The display substrate includes an array of micro-LEDs forming individual pixels. The backplane substrate includes a plurality of pixel logic hardware modules. Each pixel logic hardware module includes a local memory element configured to store a multi-bit pixel intensity value of a corresponding micro-LED for an image frame. The backplane substrate is bonded to a backside of the display substrate such that the pixel logic hardware modules are physically aligned behind the array of micro-LEDs and each pixel logic hardware module is electrically connected to a micro-LED of the corresponding pixel.

18 Claims, 10 Drawing Sheets

(56) References Cited

U.S. PATENT DOCUMENTS

| | | | |
|---|---|---|---|
| 2018/0114800 A1 | 4/2018 | Pan | |
| 2018/0197471 A1* | 7/2018 | Rotzoll | G09G 3/2085 |
| 2019/0306945 A1 | 10/2019 | Valentine | |
| 2020/0267359 A1* | 8/2020 | Seiler | G09G 3/32 |
| 2020/0410923 A1* | 12/2020 | Hudson | G09G 3/3241 |
| 2021/0043821 A1 | 2/2021 | Hussell | |
| 2021/0110762 A1* | 4/2021 | Pan | H01L 27/3262 |
| 2021/0201769 A1 | 7/2021 | Morris et al. | |
| 2021/0335165 A1* | 10/2021 | Pappas | G01R 31/2801 |
| 2022/0165208 A1* | 5/2022 | Sheth | G09G 3/3233 |

OTHER PUBLICATIONS

"International Search Report and Written Opinion Issued in PCT Application No. PCT/US22/044792", dated Jan. 19, 2023, 10 Pages.

* cited by examiner

MICRO-LED DISPLAY

BACKGROUND

Lower power consumption and smaller form factor designs are desirable in mobile devices, such as mixed reality (MR), augmented reality (AR), and virtual reality (VR) devices, in order to improve battery life, portability, and comfort. One way to streamline form factors and reduce power consumption is to employ a micro-LED display that includes an array of microscopic light emitting diodes (micro-LEDs) to form individual display pixels. A micro-LED display may provide various performance advantages over LCDs and other display technologies. For example a micro-LED display may have higher brightness, lower latency, higher contrast ratio, greater color saturation, intrinsic self-illumination, and better efficiency relative to an LCD.

SUMMARY

A display device as disclosed herein may include a display substrate and a backplane substrate. The display substrate includes an array of micro-LEDs forming individual pixels. The backplane substrate includes a plurality of pixel logic hardware modules. Each pixel logic hardware module includes a local memory element configured to store a multi-bit pixel intensity value of a corresponding micro-LED for an image frame. The backplane substrate is bonded to a backside of the display substrate such that the pixel logic hardware modules are physically aligned behind the array of micro-LEDs and each pixel logic hardware module is electrically connected to a micro-LED of the corresponding pixel.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
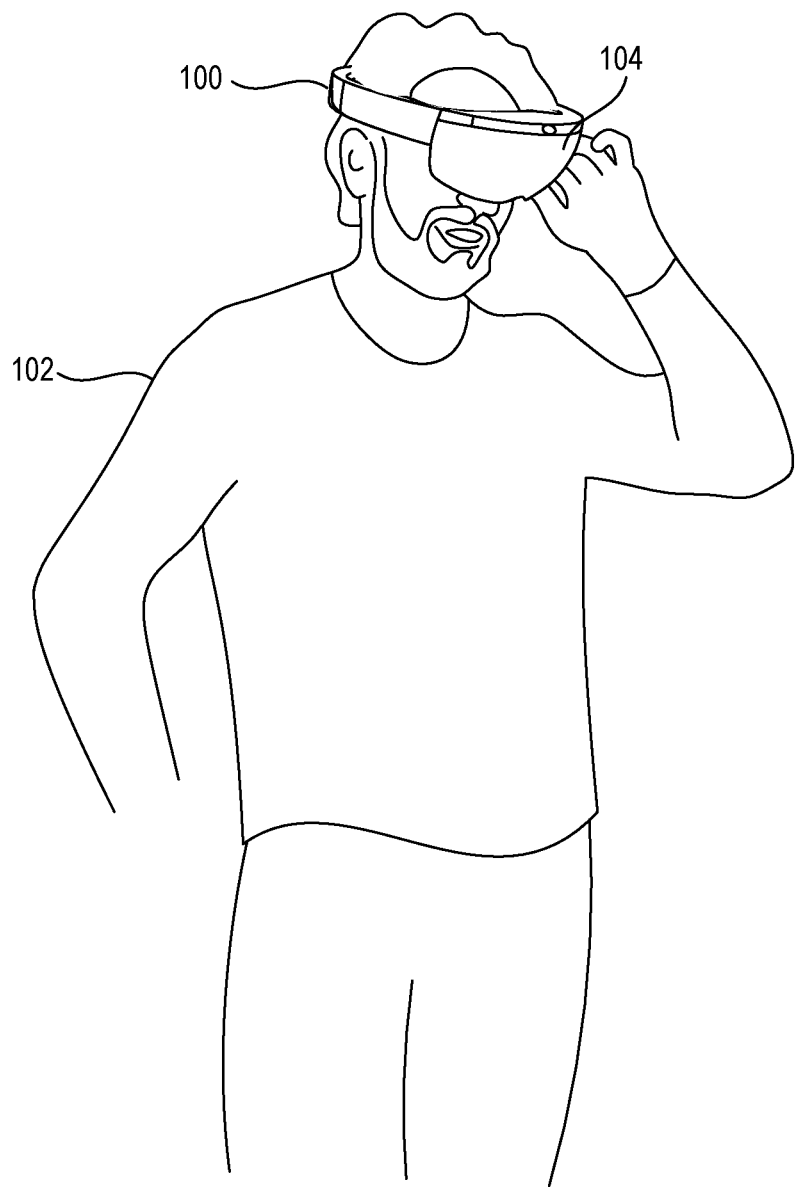
FIG. 1 shows an example near-eye display device including a micro-LED display.

A micro-LED display that includes an array of microscopic light emitting diodes (micro-LEDs) that form individual pixels of the display may be employed in a display device to provide various performance advantages over other types of display technologies, such as a liquid crystal display (LCD). For example a micro-LED display may have higher brightness, lower latency, higher contrast ratio, greater color saturation, intrinsic self-illumination, and better efficiency relative to an LCD. In some instances, a physical footprint of a micro-LED display is kept from being made smaller due to the size and configuration of the backplane substrate of the micro-LED display. In particular, the backplane substrate includes logic hardware for controlling the micro-LED array that typically is peripherally arranged around the micro-LED array. In other words, the peripheral placement of the logic hardware on the backplane substrate contributes to an overall increase in the physical footprint of the micro-LED display.

Furthermore, display performance of the micro-LED display configuration can be limited by the peripheral arrangement of logic hardware on the backplane. In particular, the logic hardware, and more particularly, memory elements of the logic hardware that store intensity values used to drive individual micro-LEDs of the array are physically spaced apart from the micro-LEDs. This undesirable spacing is due to the logic hardware being arranged around the periphery of the array of micro-LEDs. In such an arrangement, frequency modulation of a micro-LED (i.e., its drive regimen) is limited due to the physical distance that the drive signal must travel from the pixel's peripherally-located memory element to the corresponding micro-LED within the array.

Accordingly, the present description is directed to a display device that includes an improved display substrate and a backplane substrate. The display substrate includes an array of micro-LEDs forming individual pixels. The backplane substrate includes a plurality of pixel logic hardware modules. Each pixel logic hardware module includes a local memory element configured to store a multi-bit pixel intensity value of a corresponding micro-LED for an image frame. The backplane substrate is bonded to a backside of the display substrate such that the pixel logic hardware modules are physically aligned behind the array of micro-LEDs and each pixel logic hardware module is electrically connected to a micro-LED of the corresponding pixel.

By positioning the pixel logic hardware modules in physical alignment behind (or underneath) the array of micro-LEDs, as opposed to the aforementioned peripheral arrangement, the plurality of pixel logic hardware modules fit within a physical footprint of the array of micro-LEDs. Such an arrangement allows for the overall footprints of the display substrate and the backplane substrate to be reduced relative to a configuration where pixel logic hardware is arranged around a periphery of the array of micro-LEDs on the backplane substrate.

Furthermore, because the multi-bit pixel intensity values are stored locally in the local memory elements that are proximate to the micro-LEDs, a physical distance that a drive signal travels from a pixel logic hardware module to a micro-LED is reduced relative to peripheral configurations. This reduced propagation distance enables the display device to be controlled with a high-frequency modulation drive scheme that provides advantages over other display devices that operate at a lower modulation frequency (e.g., a single pulse per a field time frame). For example, operating the micro-LEDs according to such a high-frequency modulation drive scheme causes an image frame that is visually presented by the display device to be perceived as being smoothed out as the frequency modulation is suitably high enough for a human eye to not perceive any flicker effects.

Additionally, operating the micro-LEDs according to the high-frequency modulation drive scheme causes an image frame that is visually presented by the display device to have reduced blur relative to a display device that operates at a lower modulation frequency. Further, the display device configuration and the high-frequency modulation drive scheme collectively allow for an increase in display resolution to be achieved relative to other display device configurations. Moreover, in some implementations, such a configuration may allow for a modulation timing to be controlled to non-linearly encode pixel information such that more bits are concentrated in an area where the eye is more sensitive to changes in intensity.

FIG. 1 shows an example near-eye display device 100 worn by a user 102. The near-eye display device 100 includes a micro-LED display 104. The micro-LED display includes a display substrate including an array of micro-LEDs that form individual pixels of the micro-LED display 104. The micro-LED display 104 further includes a backplane substrate including a plurality of pixel logic hardware modules. The backplane substrate is bonded to a backside of the display substrate such that the pixel logic hardware modules are physically aligned behind (or underneath) the array of micro-LEDs.

In some implementations, the micro-LED display 104 may be at least partially see-through, such as in the case of a MR/AR device. In other implementations, the micro-LED display 104 may be opaque, such as in the case of a VR device.

The near-eye display device 100 is provided as a non-limiting example of a display device including a micro-LED display having a backplane substrate that is bonded to a backside of a display substrate such that a plurality of pixel logic hardware modules is physically aligned behind (or underneath) an array of micro-LEDs. The disclosed example implementations of such a micro-LED display configuration may be implemented in any suitable type of display device including a mobile display device, a wearable display device, or a display device having a static position.

Figure 2:
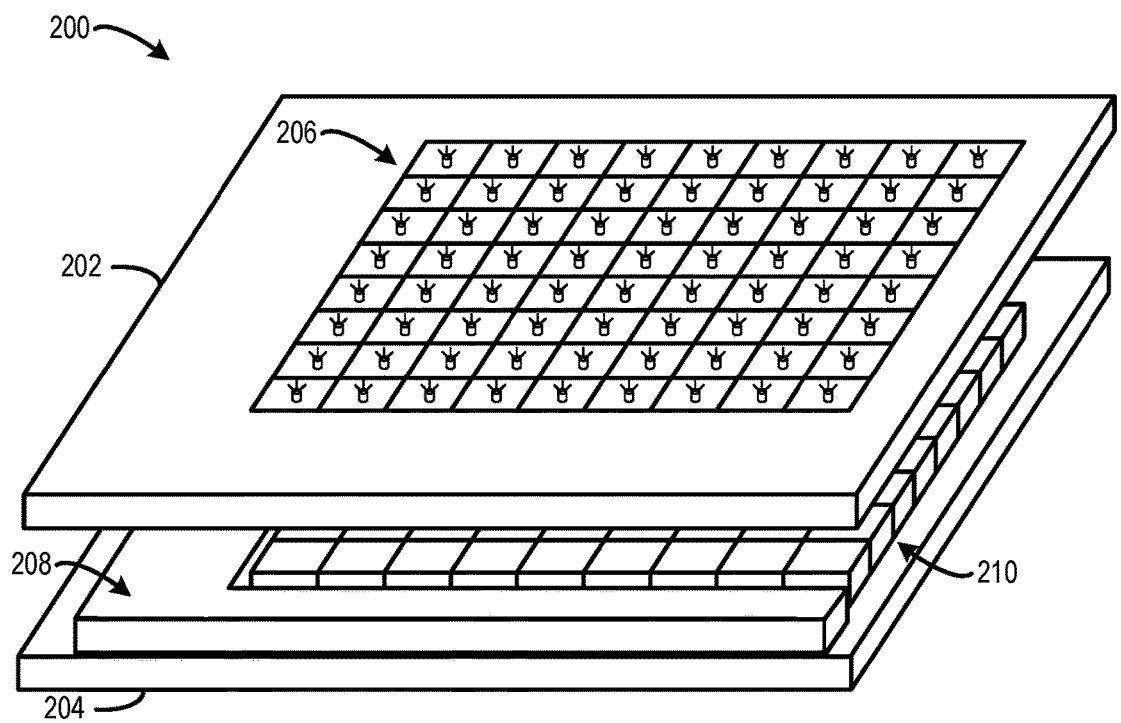
FIGS. 2-4 show an example display substrate and a corresponding backplane substrate that may be employed in a micro-LED display.
Figure 3:
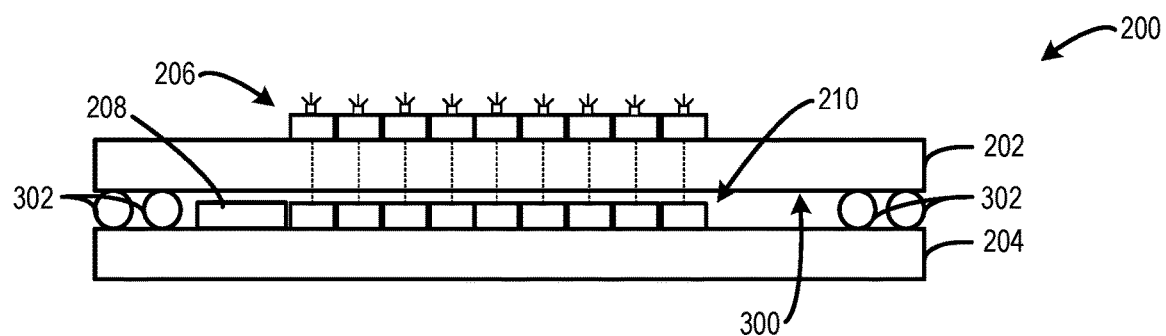
Figure 4:
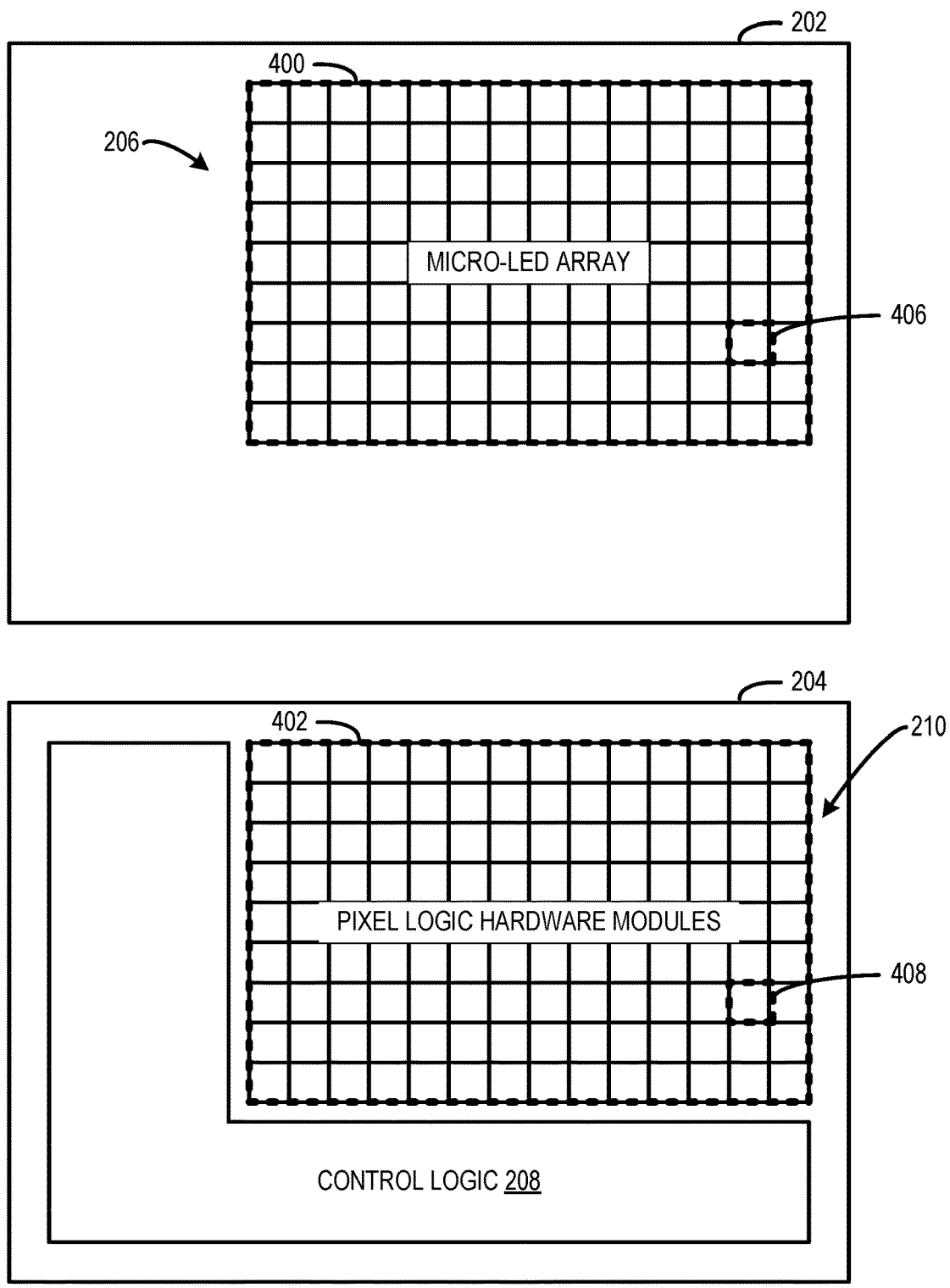

FIGS. 2-4 show an example micro-LED display 200. For example, the micro-LED display may be representative of the micro-LED display 104 of the near-eye display device 100 shown in FIG. 1. In other examples, the micro-LED display 200 may be included in another type of display device. The micro-LED display 200 includes a display substrate 202 and a backplane substrate 204. The display substrate 202 includes an array of micro-LEDs 206 that form individual pixels of the micro-LED display 200. Each of the micro-LEDs of the array 206 emits light based on being driven by a drive signal as will be discussed in further detail below.

The backplane substrate 204 includes control logic 208 and a plurality of pixel logic hardware modules 210. The control logic 208 controls operation of the array of micro-LEDs 206. For example, the control logic 208 can control the array of micro-LEDs 206 to visually present an image frame or a sequences of image frames that form a video. The control logic 208 includes various functional logic modules to provide different functionality. For example, the control logic 208 may include one or more of logical clocks, column drivers, and row drivers that are configured to synchronously update the display state of each of the micro-LEDs of the array 206 to visually present an image frame according to a designated update mode (e.g., a scan update mode or a global update mode).

Figure 5:
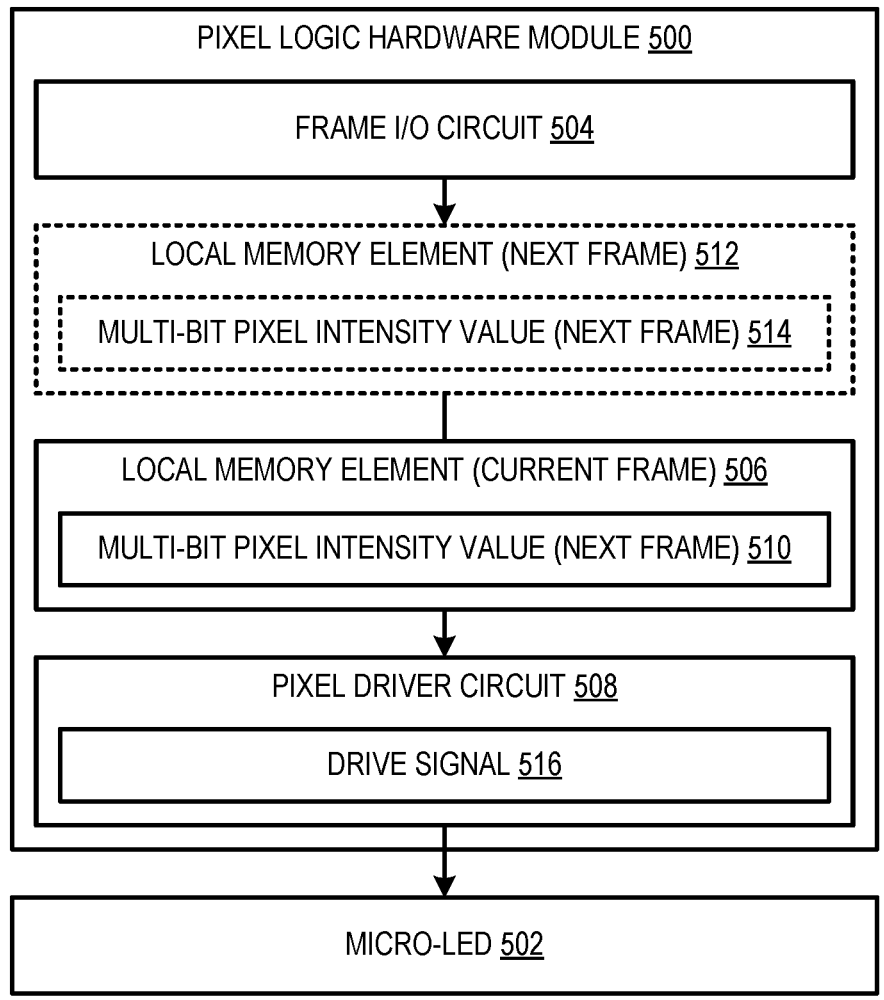
FIG. 5 shows a block diagram of an example pixel logic hardware module.

Each of the plurality of pixel logic hardware modules 210 controls operation of an individual micro-LED corresponding to that pixel logic hardware module based on logic signals received from the control logic 208 as will be discussed in further detail below with reference to FIGS. 5-6. To that end, each of the plurality of pixel logic hardware modules 210 is electrically connected to a corresponding micro-LED of the array 206.

The control logic 208 and the plurality of pixel logic hardware modules 210 may take any suitable form of hardware and/or firmware including, but not limited to, a micro-controller, an application specific integrated circuit (ASIC), a system on a chip (SoC), and/or other electronic components.

As shown in FIG. 3, the backplane substrate 204 is bonded to a backside 300 of the display substrate 202. In the illustrated implementation, the backplane substrate 204 is bonded to the display substrate 202 via a plurality of micro-bumps 302. The backplane substrate 204 may be bonded to the display substrate 202 using any suitable bonding technique.

The plurality of pixel logic hardware modules 210 is arranged on the backplane substrate 204 such that when the backplane substrate 204 is bonded to the backside 300 of the display substrate 202 the pixel logic hardware modules 210 are physically aligned behind (or underneath) the array of micro-LEDs 206. As used herein, the terms "behind" and "underneath" refer to a relative spatial relationship between the pixel logic hardware modules and the micro-LEDs when the backplane substrate is bonded to the backside 300 of the display substrate. In particular, as shown in FIG. 4, the array of micro-LEDs defines a physical footprint 400 (indicated by the dotted line) and the plurality of pixel logic hardware modules 210 is sized to fit within a physical footprint 402 (indicated by the dotted line) that is the same (or smaller than) the physical footprint 400 of the array of micro-LEDs 206.

In the illustrated implementation, each pixel corresponding to a micro-LED of the array 206 defines a physical footprint, and each of the plurality of pixel logic hardware modules 210 is sized to fit within the physical footprint of the corresponding pixel. For example, a micro-LED pixel has a physical footprint 406 and a corresponding pixel logic hardware module has a physical footprint 408 that is the same size as the physical footprint 406. In this case, the plurality of pixel logic hardware modules 210 is arranged in a similarly sized array as the array of micro-LEDs 206.

In other implementations, a plurality of pixel logic hardware modules that control a corresponding plurality of micro-LEDs may be clustered together in a common hardware module, and the common hardware module may be sized to fit within a physical footprint collectively formed by the pixels corresponding to the plurality of micro-LEDS. In one example, four pixel logic hardware modules that are configured to control four corresponding micro-LEDs may be clustered in a common hardware module that fits within a physical footprint of four pixels corresponding to the four micro-LEDs. In still other implementations, the plurality of pixel logic hardware modules 210 may be arranged in a different spatial pattern that fits within a physical footprint formed by the array of micro-LEDs 206. The plurality of pixel logic hardware modules 210 may be arranged in any suitable manner to accommodate electrical connections with the array of micro-LEDs 206 while still fitting within the physical footprint of the array of micro-LEDs 206.

The display substrate 202 and the backplane substrate 204 are bonded in a vertical stack, and a design requirement of such an arrangement dictates that both substrates have the same physical footprint. The size of the physical footprint of these substrates in the vertical stack can be reduced relative to a configuration where the plurality of pixel logic hardware modules is arranged around a periphery of the array of micro-LEDs by aligning the plurality of pixel logic hardware modules 210 behind/underneath the array of micro-LEDs 206 in the vertical stack.

The illustrated implementation is based on a 12-nanometer field effect transistor (FET) fabrication process. In other implementations that use a smaller sized fabrication process, the micro-LEDs and the pixel logic hardware modules may be fabricated on the same substrate with the pixel logic hardware modules being positioned proximate to corresponding micro-LEDs. For example, pixel logic hardware modules may be placed between pixels of the micro-LED display as space allows.

In still other implementations, three substrates may be bonded in a vertical stack. The three substrates may include a display substrate including the array of micro-LEDs, a backplane substrate including the plurality of pixel logic hardware modules, and a memory substrate including memory/display logic configured to generate image frames and store the image frames in memory.

As discussed above, each pixel logic hardware module 210 controls operation of an individual micro-LED of the array. FIG. 5 shows a block diagram of an example pixel logic hardware module 500 that is electrically connected to a micro-LED 502. The pixel logic hardware module may be representative of each of the plurality of pixel logic hardware modules 210 shown in FIGS. 2-4. The pixel logic hardware module 500 includes a frame input/output (I/O) circuit 504, a local memory element 506, and a pixel driver circuit 508.

The frame I/O circuit 504 includes a plurality of electrical connections between electronic components of the pixel logic hardware module 500 and the control logic 208. The frame I/O circuit 504 is configured to allow for the pixel logic hardware module 500 to receive various digital logic signals that are configured to control operation of the micro-LED 502. Such digital logic signals may include, but are not limited to, clock signals, data signals, enable signals, test and repair signals, and other types of digital logic signals. Additionally, the frame I/O circuit 504 receives analog signals that may be used to control operation of the micro-LED 502. For example, the frame I/O circuit 504 may be configured to receive a bias current from a current mirror circuit to control a baseline (or maximum) intensity value of the micro-LED 502 that may be used for coarse low-frequency intensity adjustment (e.g., due to changing environmental/ambient lighting conditions).

The local memory element 506 receives a multi-bit pixel intensity value 510 for an image frame (referred to herein as a current image frame) from the control logic 208 (shown in FIGS. 2-4) via the frame I/O circuit 504. The local memory element 506 locally stores the multi-bit pixel intensity value 510 in proximity to the micro-LED 502, such that the micro-LED 502 can be driven by a drive signal that is modulated based on the multi-bit pixel intensity value 510 according to a high-frequency modulation drive scheme.

The local memory element 506 may include any suitably type of electronic component that is configured to maintain/store bits of binary information until it is changed by a set/reset process. In one example, the local memory element 506 includes a static random-access memory (SRAM) element. The SRAM element may include any suitable number of memory cells to store the multi-bit pixel intensity value 510. In other examples, the local memory element 506 may include a plurality of registers, latches, another type of memory component, or a combination thereof that is configured to store the multi-bit pixel intensity value 510.

The local memory element 506 may be configured to store a multi-bit pixel intensity value having any suitable bit depth. In one example, the local memory element 506 stores a 12-bit pixel intensity value. In some examples, a storage size of the local memory element 506 and a corresponding bit depth of the multi-bit pixel intensity value 510 may be functions of the amount of available space behind or underneath the array of micro-LEDs 206 (shown in FIGS. 2-4) for the plurality of pixel logic hardware modules 210 to be placed.

Placement of the local memory element 506 in proximity to the micro-LED 502 allows for reduced clock logic and I/O lines relative to display configurations where memory elements are positioned around a periphery of the micro-LED array. Such a reduction in clock logic and I/O lines provides an overall reduction in consumption of computing resources (e.g., cost, power consumption).

In some implementations, the pixel logic hardware module 500 may include an additional local memory element 512 that is configured to store a pixel intensity value 514 for a next image frame that is visually presented subsequent to the current image frame. In some examples, the additional local memory element 512 may be configured in the same manner as the local memory element 506. In one example, the additional local memory element 512 may be configured to store a 12-bit pixel intensity value. In such an example, the pixel logic hardware module 500 would have 24-bits of local memory for a particular micro-LED allocated for pixel intensity values between the current image frame and the next image frame. By placing the local memory elements 506 and 512 proximate to the micro-LED 502, area outside the micro-LED array and overall silicon area may be reduced. Moreover, by placing the local memory elements 506 and 512 behind or underneath the array of micro-LEDs there may be enough space to allow for additional local memory elements that enable a bit depth of the pixel intensity value to be increased relative to other display configurations where frame buffers are located around a periphery of the display. Such increased bit depth provides higher resolution and increases display quality relative to those other display configurations.

In other implementations, additional memory elements (e.g., frame buffers) that are configured to store pixel intensity values for subsequent image frames may be positioned on the backplane substrate at a location that is in alignment with or outside of a periphery of the array of micro-LEDs 206 instead of behind or underneath the array of micro-LEDs 206. In some such examples, the placement of the additional memory elements may be a function of the amount of space available under the array of micro-LEDs 206.

The pixel driver circuit 508 generates, for the current image frame, a drive signal 516 based on the multi-bit pixel intensity value 510 stored in the local memory element 506. The micro-LED 502 is driven by the drive signal 516 to control an intensity of light emitted by the micro-LED 502 for the current image frame. The pixel driver circuit 508 may be configured to generate the drive signal 516 for each image frame based on the multi-bit pixel intensity value 510 stored in the local memory element 506 for that image frame. The pixel logic hardware module 500 may be configured to update the values stored in the local memory element 506 (and the additional local memory element 512) based on one or more signals received from the control logic 208 (shown in FIGS. 2-4) via the frame I/O circuit 504.

The micro-LED 502 is configured to operate in a current mode in which a change in current of the drive signal 516 causes a linear change in intensity of the micro-LED 502. By controlling the micro-LED 502 in the current mode a baseline (or maximum) intensity of the micro-LED can be changed simply by changing a bias current of a current source of the pixel driver circuit 508. Such functionality allows for a wide range of intensities emitted by the micro-LED 502 that can adjust with ambient lighting of the environment or based on other operating conditions.

Figure 6:
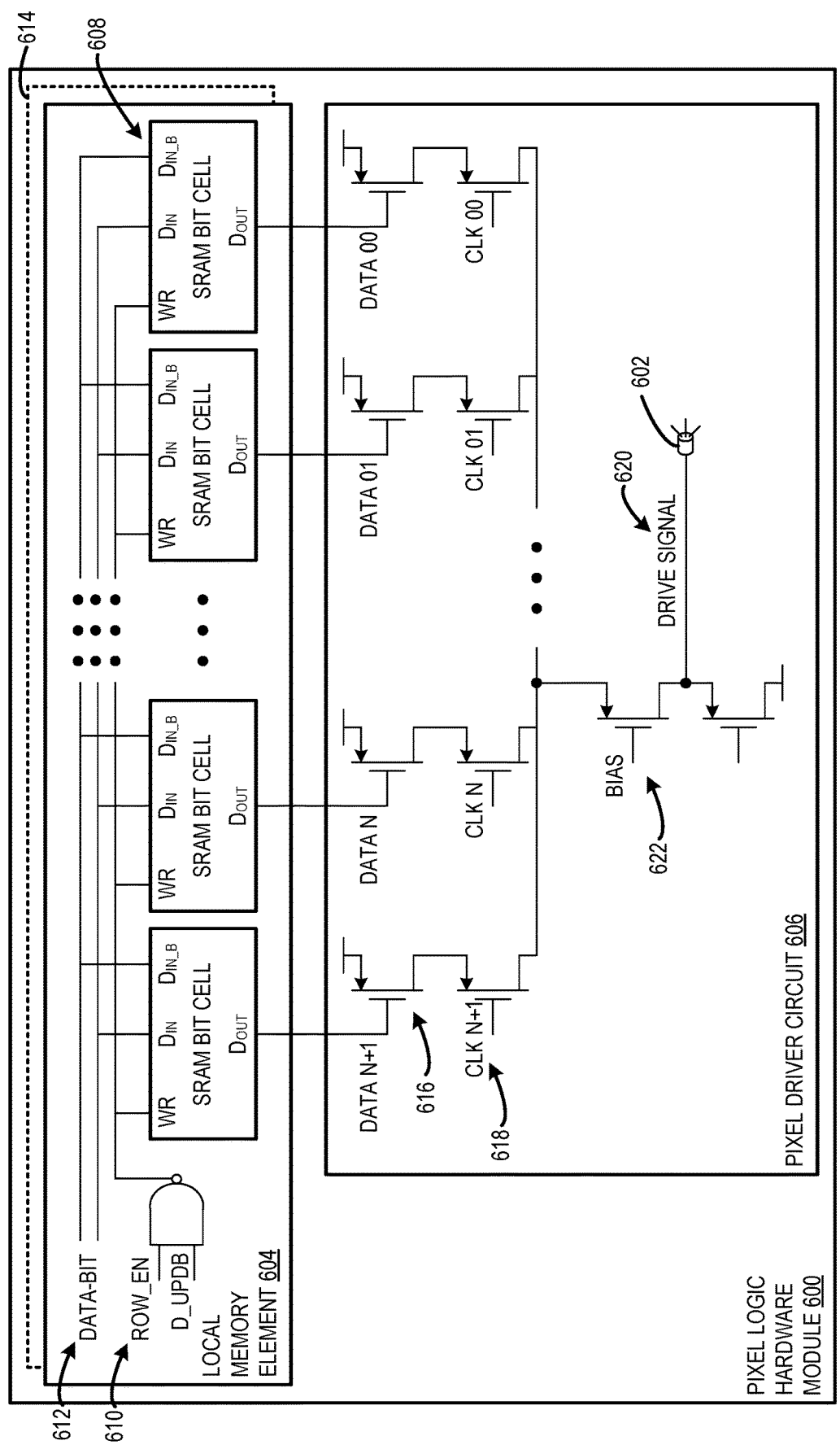
FIG. 6 shows a circuit diagram of an example pixel logic hardware module.

FIG. 6 shows a circuit diagram of an example pixel logic hardware module 600. For example, the pixel logic hardware module 600 may be representative of the pixel logic hardware module 500 shown in FIG. 5 and each of the plurality of pixel logic hardware modules 210 shown in FIGS. 2-4. The pixel logic hardware module 600 is electrically connected to a micro-LED 602. For example, the micro-LED 602 may be representative of the micro-LED 502 shown in FIG. 5. The pixel logic hardware module 600 includes a local memory element 604 electrically connected to a pixel driver circuit 606.

The local memory element 604 includes a plurality of memory cells 608 each configured to store a different bit of a multi-bit pixel intensity value. The local memory element 604 may include any suitable number of memory cells 608. In one example, the local memory element 604 includes 12 memory cells and is configured to store a 12-bit pixel intensity value. In the illustrated implementation, the local memory element 604 is configured as an SRAM element including a plurality of SRAM memory cells. In other implementations, the local memory element 604 may assume a different form.

Each of plurality of memory cells 608 is electrically connected in serial. The local memory element 604 includes a selector circuit 610 that is configured to select a memory cell of the plurality of memory cells to which to write a designated data bit 612 of the multi-bit pixel intensity value. The local memory element 604 is configured to, upon receiving the multi-bit pixel intensity value from the control logic 208 (shown in FIGS. 2-4) via the frame I/O circuit 504 (shown in FIG. 5), individually select a different memory cell of the plurality of memory cells 608 one at a time using the selector circuit 610 to serially write each bit of the multi-bit pixel intensity value to the plurality of memory cells 608. For example, the multi-bit pixel intensity value may be stored in the plurality of memory cells in a descending order from the most significant bit to the least significant bit or vice versa.

Although the serial memory cell configuration may take longer to store the multi-bit pixel intensity value locally relative to a parallel memory cell configuration, the plurality of memory cells 608 may be serially connected in order to reduce a number of I/O connections between the local memory element 604 and the control logic 208 (shown in FIGS. 2-4). Such a reduction in I/O connections may reduce an overall size of the footprint of the substrates in the micro-LED display. However, in some implementations, where write speed is prioritized over footprint reduction, the plurality of memory cells of the local memory element may be electrically connected in parallel.

In some implementations, the local memory element 604 may include one or more redundant memory cells in addition to the plurality of memory cells designated to store the multi-bit pixel intensity value. In such implementations, the control logic 208 (shown in FIGS. 2-4) and/or the local memory element 604 may be configured to determine that one or more memory cells of the plurality of memory cells are degraded and write one or more bits of the multi-bit pixel intensity value to the one or more redundant memory cells instead of the one or more degraded memory cell based on said determining.

In some implementations, the pixel logic hardware module 600 may include an additional local memory element 614 that is configured in the same manner as the local memory element 604 and is configured to store a multi-bit pixel intensity value for a next image frame.

The pixel driver circuit 606 includes a first plurality of transistors 616 each electrically connected to a data output line of a different memory cell of the plurality of memory cells 608. A second plurality of transistors 618 is each connected in series with a corresponding transistor of the first plurality of transistors 616. Each of the second plurality of transistors 618 is controlled by individual clock signals. The first plurality of transistors 616 and the second plurality of transistors 618 collectively form a drive switch to configured to generate a drive signal 620 to drive the micro-LED 602. By varying the time that the switch is turned on, the current of the drive signal 620 sent to the micro-LED 602 will change causing a linear change in intensity of the micro-LED 602.

The pixel driver circuit 606 includes a bias transistor 622 configured to change a bias current of the drive signal 620. The bias current may be adjusted to adjust the baseline (or maximum) intensity of the micro-LED 602. The control logic 208 (shown in FIGS. 2-4) may be configured to adjust the baseline intensity of the micro-LED 602 to account for changing operating conditions, such as changes in ambient lighting.

Figure 7:
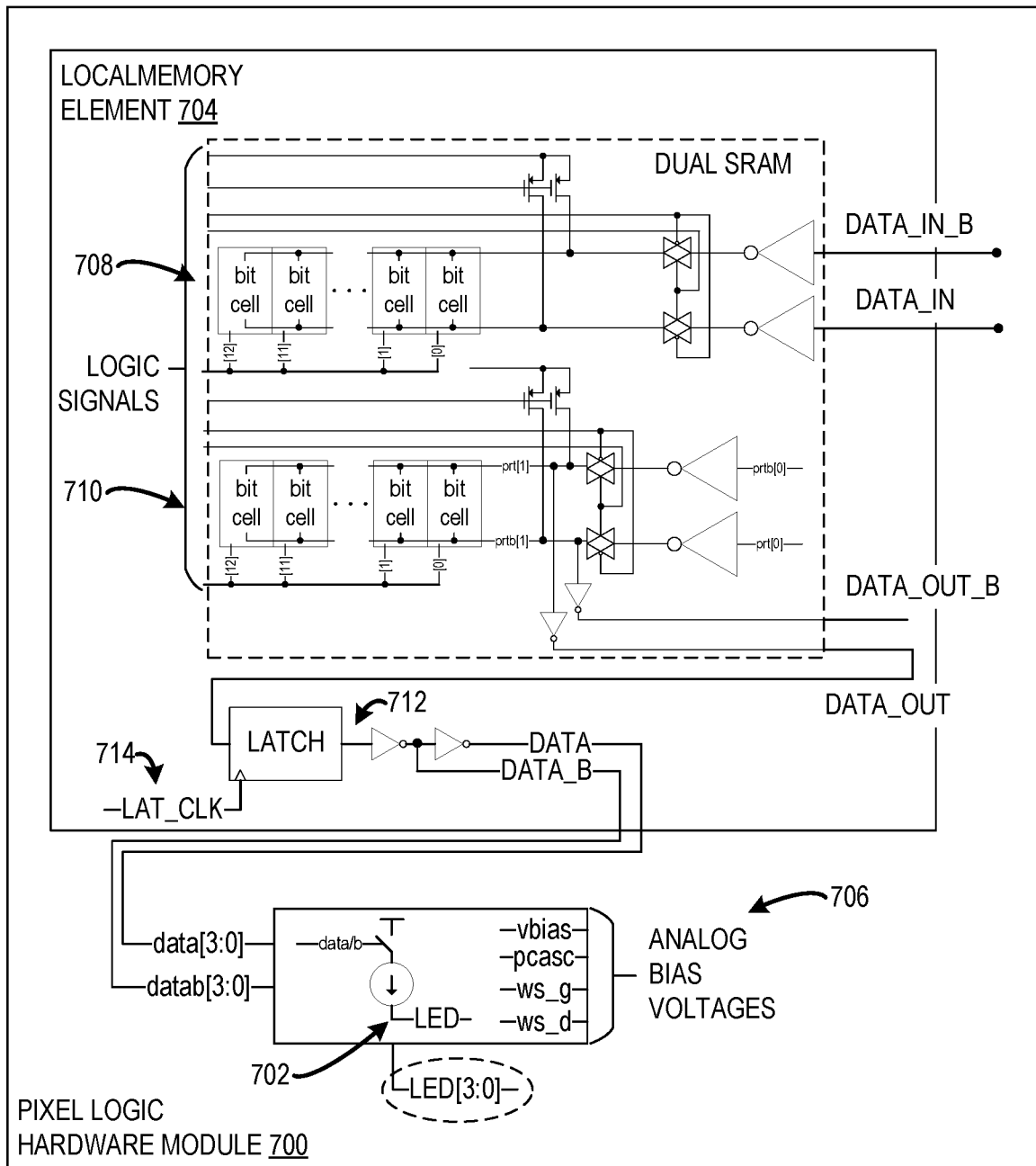
FIG. 7 shows a circuit diagram of another example pixel logic hardware module.

FIG. 7 shows a circuit diagram of another example pixel logic hardware module 700 that is configured to allow for a modulation timing to be adjusted non-linearly to change an encoding of the display resolution that effectively increases the display resolution relative to other display device configurations. For example, the pixel logic hardware module 700 may be representative of the pixel logic hardware module 500 shown in FIG. 5 and each of the plurality of pixel logic hardware modules 210 shown in FIGS. 2-4. The pixel logic hardware module 700 is electrically connected to a micro-LED 702. For example, the micro-LED 702 may be representative of the micro-LED 502 shown in FIG. 5. The pixel logic hardware module 700 includes a local memory element 704 electrically connected to a pixel driver circuit 706.

In the illustrated implementation, the local memory element 704 is a dual SRAM element that includes a first plurality of memory cells 708 each configured to store a different bit of a multi-bit pixel intensity value of a current image frame. The local memory element 704 further includes a second plurality of memory cells 710 each configured to store a different bit of a multi-bit pixel intensity value of a next image frame. The local memory element 704 may include any suitable number of memory cells. In one example, the local memory element 704 includes 12 memory cells for each image frame and those memory cells are configured to store a 12-bit pixel intensity value for each image frame.

Each of the memory cells is electrically connected in serial. The local memory element 704 is configured to, upon receiving the multi-bit pixel intensity value from the control logic 208 (shown in FIGS. 2-4) via the frame I/O circuit 504 (shown in FIG. 5), individually select a different memory cell of the plurality of memory cells 608 one at a time to serially write each bit of the multi-bit pixel intensity value to the plurality of memory cells.

The pixel logic hardware module 700 is configured such that a signal path from the local memory element 704 to the pixel drive circuit 706 is the same for each bit of the pixel intensity value. In particular, each bit is buffered in a latch 712 that is controlled by a latch clock signal 714. In other words, the clock path for each bit now goes through the same exact buffers (with no mismatch). Further, the switches used to turn on the current at the pixel drive circuit 706 are the same for each bit (with no mismatch). Such an arrangement pushes signal timing matching requirements onto the timing path, and since the timing path uses the same buffer/latching path for all bits, the matching requirements are further pushed back to the root of the clock buffering point. In other words, the accuracy of the modulation of the micro-LED 702 is determined by the timing of the latch clock signal 714. The buffers to this signal are the same, so the only difference is what is desired and put in at the root of all the buffers by the clock generation circuits. Such an arrangement allows for the latch clock signal 714 timing to be adjusted non-linearly to make a different encoding other than a 12-bit linear DAC encoding.

In one example, the micro-LED 702 is modulated at a frequency of 50 cycles at 120 Hz per field time frame. In order to achieve 12-bit resolution, the least significant bit (LSB) is 1/4096 of the entire range and timing accuracy is on the order of: 1 LSB=1/(120*50*4096)=40 ns. This timing can be controlled to achieve accuracy on the order of ~10 ps by adjusting the timing of the latch clock signal 714. Such timing adjustment allows for a linear resolution having an order of magnitude greater than the 12-bit resolution described above. The timing of the latch clock signal 714 can be controlled to achieve any desired resolution pixel intensity value based on having suitable memory to store such a pixel intensity value in the pixel logic hardware module.

In some implementations, the pixel intensity value may be encoded in a non-linear fashion. For example, a non-linear encoding may be useful for display configurations that interface with a user's eye, because the eye's sensitivity to light modulation is non-linear as well. In the example of a 12-bit pixel intensity value, such non-linear encoding of the pixel intensity value effectively uses the 12-bit information in a more efficient manner by encoding more of the bits in a designated intensity range where the eye is more sensitive to changes in intensity. Such non-linear encoding can be achieved by adjusting the timing of the latch clock signal 714. The pixel logic hardware module 700 may be configured to adjust the timing of the latch clock signal 714 to non-linearly encode the pixel intensity value according to any suitable drive scheme.

Figure 8:
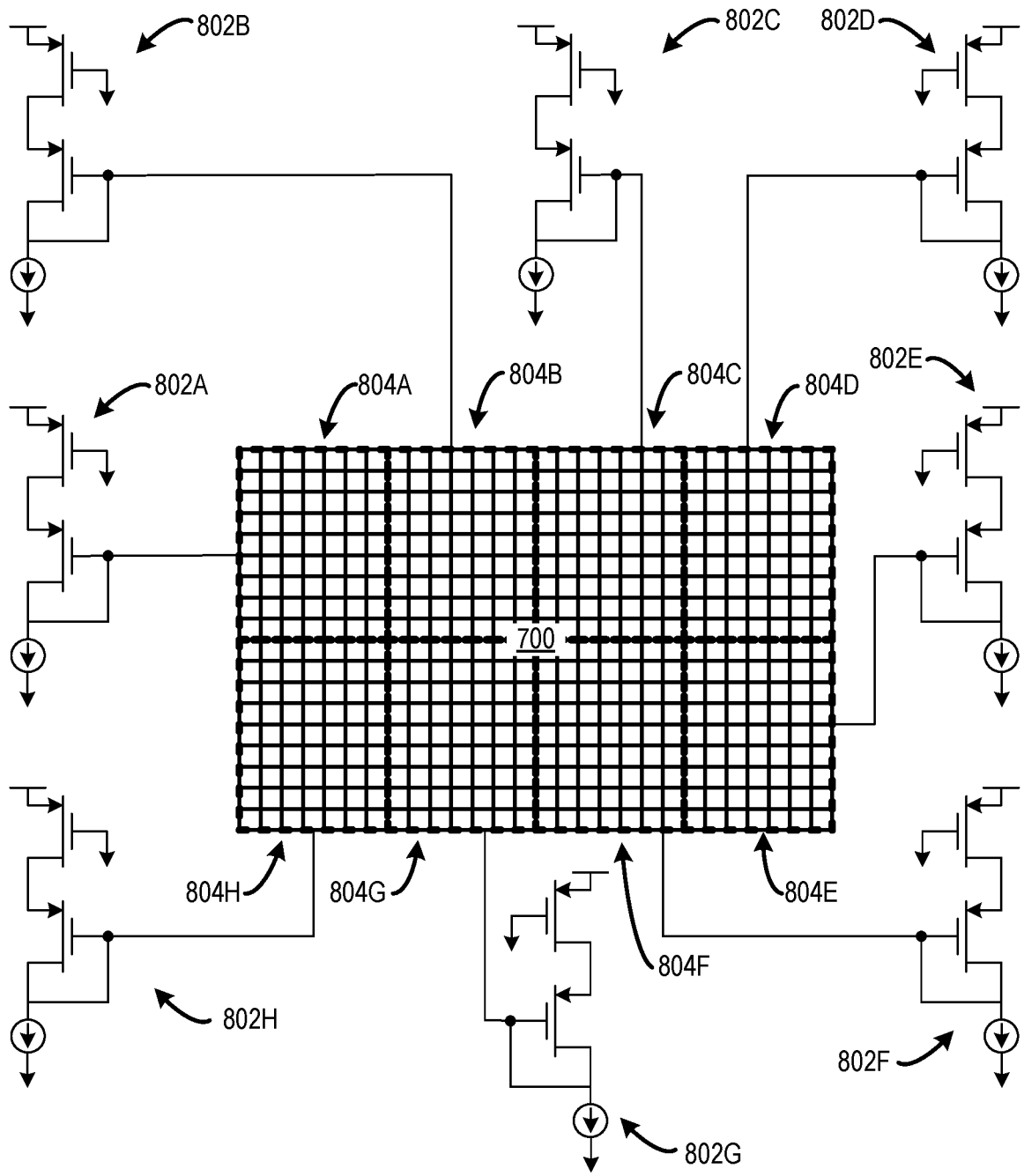
FIG. 8 shows a circuit diagram of an example bias circuit configuration for a micro-LED display.

In some implementations, the bias current may be controlled by a plurality of current mirror circuits electrically connected to the array of micro-LEDs. FIG. 8 shows a circuit diagram of an example bias circuit configuration for a micro-LED display 800. For example, the micro-LED display 800 may be representative of the micro-LED display 200 shown in FIGS. 2-4. The micro-LED display 800 includes an array of micro-LEDs that form individual pixels of the micro-LED display 800. A plurality of current mirror circuits 802 (e.g., 802A-802H) may be positioned on the backplane substrate 204 (shown in FIGS. 2-4). The plurality of current mirror circuit 802 may be controlled by and/or incorporated into the control logic 208 (shown in FIGS. 2-4). In some implementations, the plurality of current mirror circuits 802 may be positioned on the same substrate as the array of micro-LEDs (and the plurality of pixel logic hardware modules).

The plurality of current mirror circuits 802 is electrically connected to different micro-LEDs of the micro-LED display 800. In the illustrated example, eight current mirror circuits are electrically connected to eight different regions 804 (e.g., 804A-804H) of micro-LEDs. Each current mirror circuit is configured to control a bias current of a different region of micro-LEDs. For example, the current mirror circuit 802A is configured to control the bias current of the micro-LEDs of the region 802A. Each current mirror circuit may be configured to control a bias current to any suitable current level (e.g., 40 micro-Amps 160 micro-Amps). Any suitable number of current mirror circuits may be electrically connected to the micro-LED display 800 to provide any suitable level of granularity of intensity adjustment.

In some examples, the control logic 208 adjusts a global intensity (e.g., a baseline or maximum intensity) of the array of micro-LEDs of the micro-LED display 800 by adjusting a bias current of the plurality of current mirror circuits 802. For example, the control logic 208 may make global intensity adjustments to compensate for changes environmental conditions, such as changes in ambient lighting. The control logic 208 may adjust the global intensity of the micro-LED display 800 based on any suitable operating conditions.

In some examples, the control logic 208 is configured to adjust a regional intensity of a selected region of micro-LEDs by adjusting a bias current of a current mirror corresponding to the selected region. For example, the control logic 208 may make global intensity adjustments to compensate for a gradient that may occur across the micro-LED array as a result of manufacturing tolerances. Such gradient compensation may make the baseline intensity appear to be uniform across the micro-LED display 800.

In either case of regional or global intensity adjustments, such adjustments may be employed for lower frequency intensity adjustment that may occur over a longer duration (e.g., ~10 ms). On the other hand, high frequency intensity modulation is controlled according to a drive scheme based on the multi-bit pixel intensity value for each micro-LED of the micro-LED display 800.

Figure 9:
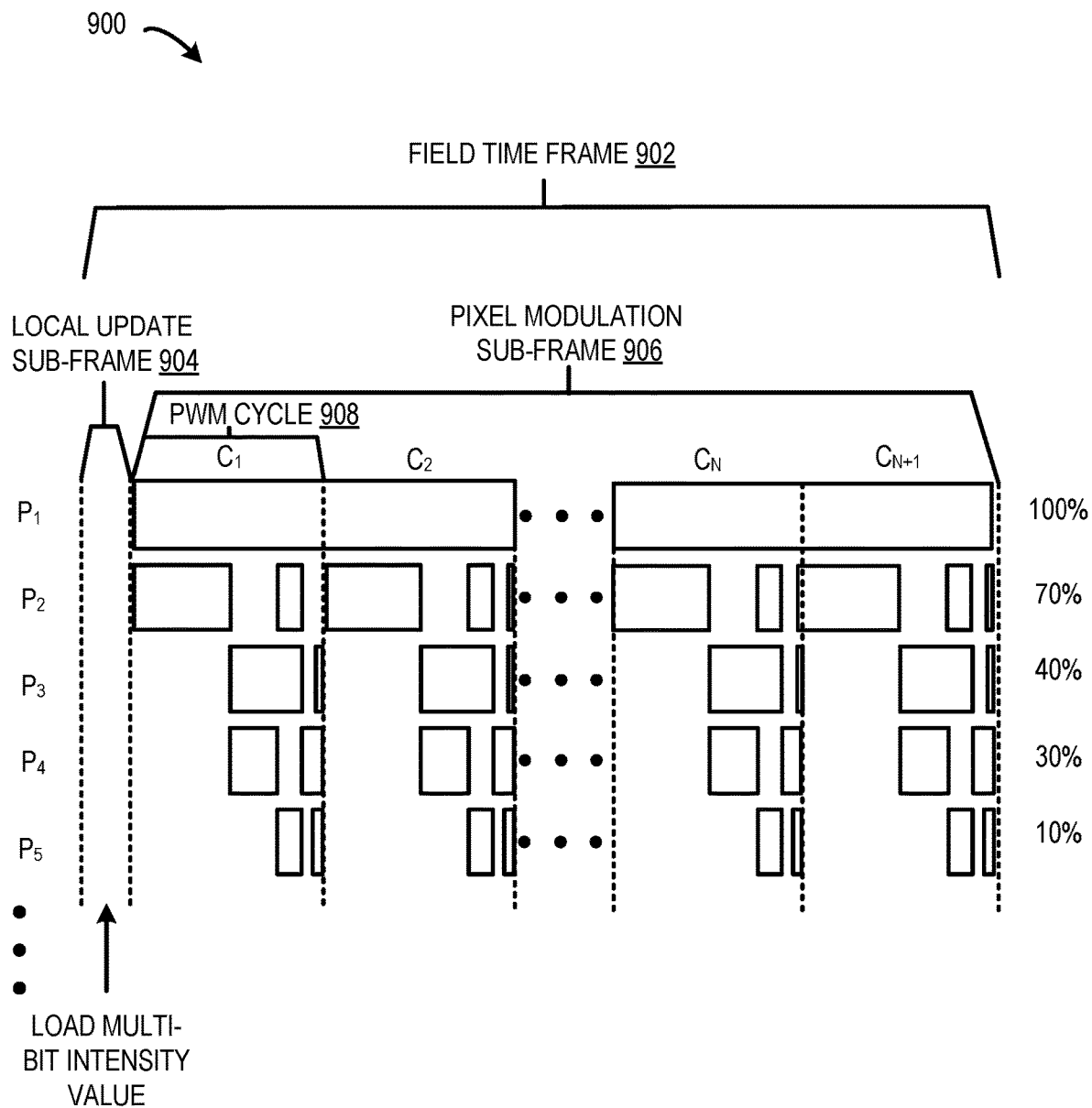
FIG. 9 shows an example field time frame of a drive scheme for a micro-LED display.

FIG. 9 shows an example drive scheme 900 for a micro-LED display. For example, the drive scheme 900 may be employed by the control logic 208 shown in FIGS. 2-4 to control operation of the micro-LED display 200. The drive scheme 900 defines a field time frame 902 that is a duration designated for the display device to visually present a pixel in an image frame. The field time frame 902 may be the same for each pixel of the micro-LED display. In some examples, pixels of the micro-LED display may be updated according to a global update mode in which pixels in all rows of the array are updated at the same time. In other examples, the pixel of the micro-LED display may be updated according to a scanning update mode in which different pixels in different rows of the array are updated at times that are staggered per row. The field time frame 902 is repeated for each image frame that is visually presented by the display device. The field time frame 902 may be repeated at any suitable frame rate.

The field time frame 902 includes a local update sub-frame 904 and a modulation sub-frame 906 that is separate from the local update sub-frame 904. In other words, the sub-frames do not temporally overlap. During the local update sub-frame 904, the control logic 208 is configured to write a multi-bit pixel intensity value for an image frame associated with the field time frame 902 to a local memory element of a corresponding pixel. Further, during the pixel modulation sub-frame 906, the control logic 208 is configured to drive the micro-LED of the corresponding pixel based on a drive signal that is modulated based on the multi-bit pixel intensity value stored in the local memory element. The drive signal is modulated based on the multi-bit pixel intensity value for a pulse width modulation (PWM) cycle 908. For example, for a first pixel ($P_1$), the duty cycle of the drive signal is 100% intensity for the PWM cycle; for a second pixel ($P_2$), the duty cycle of the drive signal is 70% intensity for the PWM cycle, a third pixel ($P_3$), the duty cycle of the drive signal is 40% intensity for the PWM cycle, a fourth pixel ($P_4$), the duty cycle of the drive signal is 30% intensity for the PWM cycle, a fifth pixel ($P_5$), the duty cycle of the drive signal is 10% intensity for the PWM cycle, and so on for all of the pixels of the micro-LED display. Note that these duty cycles are provided as non-limiting examples and in operation the duty cycles are determined based on the multi-bit pixel intensity value that is stored in the local memory element corresponding to the pixel.

The drive scheme 900 dictates that the PWM cycle 908 is repeated at a frequency of at least two modulation cycles per the field time frame 902. The PWM cycle 908 may be repeated at any suitable frequency within the field time frame 902. In some examples, the drive scheme 900 may dictate that the drive signal is modulated for a pulse width modulation cycle that is repeated at a frequency of more than two (e.g., at least fifty) cycles per the field time frame.

The structure of the display device, and more particularly, the placement of the local memory elements on the backplane substrate in proximity to the micro-LEDs allows for the frequency of the PWM cycle to be increased relative to other display devices where memory elements are positioned further away from micro-LEDs. Increasing the frequency that the PWM cycle is repeated within the field time frame increases display quality by smoothing visual presentation of an image frame while also reducing blur effects. Moreover, by separating the field time frame 902 into the local update sub-frame 904 and the modulation sub-frame 906, the PWM frequency is not dependent on memory updates, which also contributes to increasing the PWM frequency.

Figure 10:
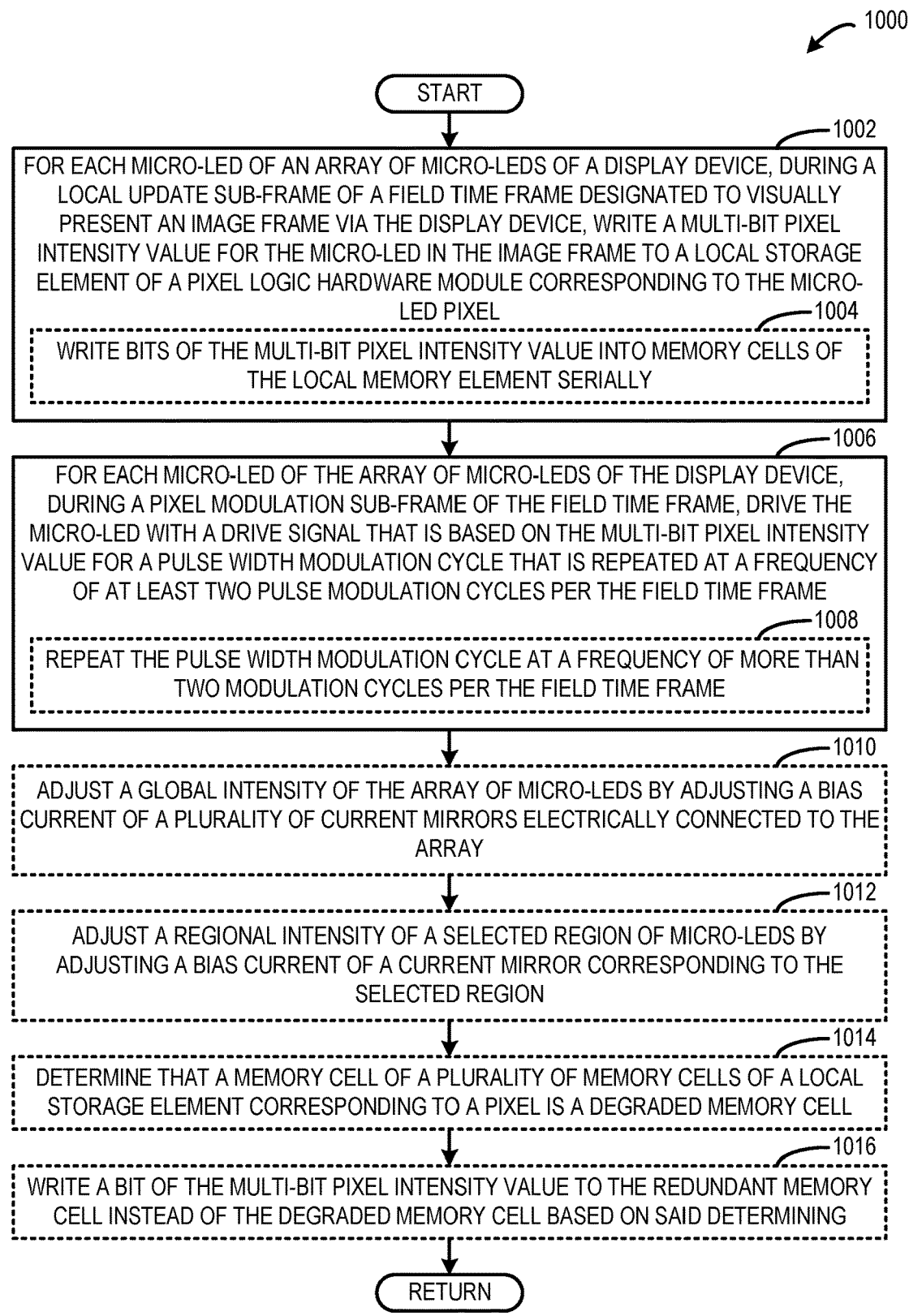
FIG. 10 shows an example method controlling a micro-LED display.

FIG. 10 shows an example method 1000 controlling a micro-LED display. For example, the method 1000 may be performed by the near-eye display device 100 shown in FIG. 2, the micro-LED display 200, or another display device that includes a micro-LED display including the structural features described herein. For example, such a micro-LED display may include a display substrate and a backplane substrate. The display substrate may include an array of micro-LEDs that form individual pixels. The backplane substrate may be bonded to a backside of the display substrate such that a plurality of pixel logic hardware modules of the backplane substrate is physically aligned behind the array of micro-LEDs. In other implementations, the array of micro-LEDs and the plurality of pixel logic hardware modules may be incorporated into the same substrate with the plurality of pixel logic hardware modules being placed proximate to corresponding micro-LEDs of the array of micro-LEDs. For example, pixel logic hardware modules may be placed between pixels of the micro-LED display as space allows.

At 1002, the method 1000 includes for each micro-LED of the array, during a local update sub-frame of a field time frame designated to visually present an image frame, writing a multi-bit pixel intensity value for the image frame to a local memory element of a pixel logic hardware module corresponding to the micro-LED.

In some implementations, the local memory element may include a plurality of memory cells that are electrically connected in serial, and at 1004, the method 1000 may include writing bits of the multi-bit pixel intensity value into the plurality of memory cells serially. Such a serial connection of the memory cells may reduce a number of I/O lines on the backplane substrate and correspondingly may reduce an overall footprint of the backplane substrate.

At 1006, the method 1000 includes during a pixel modulation sub-frame of the field time frame, driving the micro-LED with a drive signal that is based on the multi-bit pixel intensity value for a pulse width modulation cycle that is repeated at a frequency of at least two pulse modulation cycles per the field time frame. In some implementations, at 1008, the method 1000 may include repeating the pulse width modulation cycle at a frequency of more than two pulse width modulation cycles per the field time frame. In one example, the pulse width modulation cycle may be repeated at a frequency of at least fifty pulse width modulation cycles per the field time frame. By modulating the drive signal at a such a high frequency, display quality may be increased by smoothing the image and reducing blur effects.

In some implementations, at 1010, the method 1000 may include adjusting a global intensity of the array of micro-LEDs by adjusting a bias current of a plurality of current mirror circuits electrically connected to the micro-LEDs of the array. The global intensity corresponds to a baseline (or maximum) intensity of the micro-LEDs. For example, the global intensity may be adjusted to compensate for changes in ambient lighting or other environmental conditions in order to increase display quality.

In some implementations at 1012, the method 1000 may include adjusting a regional intensity of a selected region of micro-LEDs by adjusting a bias current of a current mirror circuit corresponding to the selected region. The regional intensity corresponds to a baseline (or maximum) intensity of the micro-LEDs in the selected region of the array. For example, the regional intensity may be adjusted to compensate for a gradient in intensity across different regions of the array of micro-LEDs. Such gradient compensation may increase display quality by making the baseline intensity across micro-LED display uniform.

In some implementations where the local memory elements each include one or more redundant memory cells, at 1014 the method 1000 may include determining, for a local memory element, that a memory cell of the plurality of memory cells is a degraded memory cell. At 1016, the method 1000 may include writing a bit of the multi-bit pixel intensity value to a redundant memory cell instead of the degraded memory cell based on said determining. Such a redundant memory feature allows for a local memory element to continue working properly even when a memory cell of the local memory element has degraded.

The method may be performed to control a micro-LED display according to a high-frequency modulation drive scheme that provides advantages over other display devices that operate at a lower modulation frequency (e.g., a single pulse per a field time frame). For example, operating the micro-LEDs according to such a high-frequency modulation drive scheme causes an image frame that is visually presented by the display device to be perceived as being smoothed out as the frequency modulation is suitably high enough for a human eye to not perceive any flicker effects. Additionally, operating the micro-LEDs according to the high-frequency modulation drive scheme causes an image frame that is visually presented by the display device to have reduced blur relative to a display device that operates at a lower modulation frequency.

Although the micro-LED display is discussed herein in the context of being used with a near-eye augmented/mixed/virtual reality device, the concepts discussed herein are broadly applicable to any suitable display device.

In some implementations, the methods and processes described herein may be tied to a computing system of one or more computing devices. In particular, such methods and processes may be implemented as computer hardware, a computer-application program or service, an application-programming interface (API), a library, and/or other computer-program product.

Figure 11:
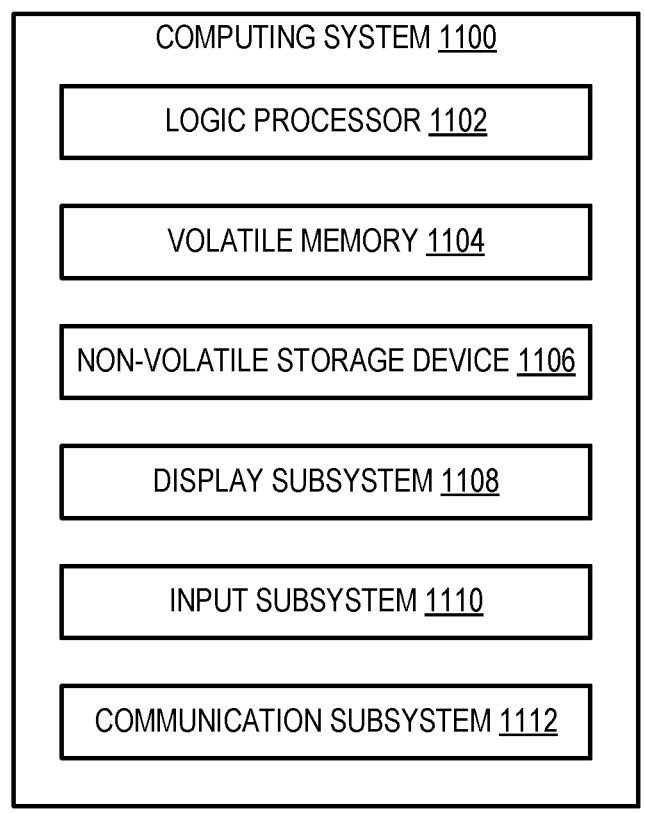
FIG. 11 shows a block diagram of an example computing system.

FIG. 11 schematically shows a non-limiting implementation of a computing system 1100 that can enact one or more of the methods and processes described above. Computing system 1100 is shown in simplified form. Computing system 1100 may embody the near-eye display device 100 shown in FIG. 1, the micro-LED display 200 shown in FIGS. 2-4, and any other suitable device that includes the micro-LED display 200 described herein. Computing system 1100 may take the form of one personal computers, server computers, tablet computers, home-entertainment computers, network computing devices, gaming devices, mobile computing devices, mobile communication devices (e.g., smart phone), and/or other computing devices, and wearable computing devices such as head-mounted, near-eye augmented/mixed/virtual reality devices.

Computing system 1100 includes a logic processor 1102, volatile memory 1104, and a non-volatile storage device 1106. Computing system 1100 may optionally include a display subsystem 1108, input subsystem 1110, communication subsystem 1112, and/or other components not shown in FIG. 11.

Logic processor 1102 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 1102 may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 1102 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 1106 includes one or more physical devices configured to hold instructions executable by the logic processors to implement the methods and processes described herein. When such methods and processes are implemented, the state of non-volatile storage device 1106 may be transformed—e.g., to hold different data.

Non-volatile storage device 1106 may include physical devices that are removable and/or built-in. Non-volatile storage device 1106 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1106 may include nonvolatile, dynamic, static, read/write, read-only, sequential-access, location-addressable, file-addressable, and/or content-addressable devices. It will be appreciated that non-volatile storage device 1106 is configured to hold instructions even when power is cut to the non-volatile storage device 1106.

Volatile memory 1104 may include physical devices that include random access memory. Volatile memory 1104 is typically utilized by logic processor 1102 to temporarily store information during processing of software instructions. It will be appreciated that volatile memory 1104 typically does not continue to store instructions when power is cut to the volatile memory 1104.

Aspects of logic processor 1102, volatile memory 1104, and non-volatile storage device 1106 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1108 may be used to present a visual representation of data held by non-volatile storage device 1106. The visual representation may take the form of a graphical user interface (GUI). As the herein described methods and processes change the data held by the non-volatile storage device, and thus transform the state of the non-volatile storage device, the state of display subsystem 1108 may likewise be transformed to visually represent changes in the underlying data. Display subsystem 1108 may include one or more display devices utilizing virtually any type of technology. Such display devices may be combined with logic processor 1102, volatile memory 1104, and/or non-volatile storage device 1106 in a shared enclosure, or such display devices may be peripheral display devices.

When included, input subsystem 1110 may comprise or interface with one or more user-input devices such as a keyboard, mouse, touch screen, microphone for speech and/or voice recognition, a camera (e.g., a webcam), or game controller.

When included, communication subsystem 1112 may be configured to communicatively couple various computing devices described herein with each other, and with other devices. Communication subsystem 1112 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some implementations, the communication subsystem may allow computing system 1100 to send and/or receive messages to and/or from other devices via a network such as the Internet.

In an example, a display device comprises a display substrate including an array of micro-LEDs that form individual pixels, and a backplane substrate including a plurality of pixel logic hardware modules, each pixel logic hardware module including a local memory element configured to store a multi-bit pixel intensity value of a corresponding pixel for an image frame, wherein the backplane substrate is bonded to a backside of the display substrate such that the pixel logic hardware modules are physically aligned behind the array of micro-LEDs, and wherein each pixel logic hardware module is electrically connected to a corresponding micro-LED. In this example and/or another example, the backplane substrate may include control logic configured to individually control an intensity of each micro-LED of the array according to a drive scheme that defines a field time frame in which the display device visually presents the image frame, the drive scheme may dictate that a micro-LED be driven by a drive signal that is modulated based on the multi-bit pixel intensity value stored in the local memory element corresponding to the pixel formed by the micro-LED for a pulse width modulation cycle that is repeated at a frequency of at least two modulation cycles per the field time frame. In this example and/or another example, the field time frame may include a local update sub-frame and a modulation sub-frame, during the local update sub-frame the control logic may be configured to write the multi-bit pixel intensity value for the image frame to the local memory element, and during the pixel modulation sub-frame the control logic may be configured to drive the micro-LED based on the drive signal. In this example and/or another example, the drive scheme may dictate that the drive signal is modulated for a pulse width modulation cycle that is repeated at a frequency of more than two cycles per the field time frame. In this example and/or another example, each micro-LED may be configured to operate in a current mode in which a change in current of the drive signal causes a linear change in intensity of the micro-LED. In this example and/or another example, the backplane substrate may include a plurality of current mirror circuits electrically connected to the array of micro-LEDs, and the control logic may be configured to adjust a global intensity of the array of micro-LEDs by adjusting a bias current of the plurality of current mirror circuits. In this example and/or another example, the backplane substrate may include a plurality of current mirror circuits electrically connected to a plurality of different regions of micro-LEDs of the array, and the control logic may be configured to adjust a regional intensity of a selected region of micro-LEDs by adjusting a bias current of a current mirror circuit corresponding to the selected region. In this example and/or another example, the local memory element may include a plurality of memory cells configured to store the multi-bit pixel intensity value and a redundant memory cell, and the control logic may be configured to 1) determine that a memory cell of the plurality of memory cells is a degraded memory cell and 2) write a bit of the multi-bit pixel intensity value to the redundant memory cell instead of the degraded memory cell based on said determining. In this example and/or another example, the local memory element may be a first local memory element, the image frame may be a first image frame, and each pixel logic hardware module may further include a second local memory element configured to store a pixel intensity value of a corresponding micro-LED for a second image frame that is visually presented by the display device subsequent to the first image frame. In this example and/or another example, the local memory element may include a static random-access memory (SRAM) element. In this example and/or another example, the SRAM element may be configured to store a 12-bit pixel intensity value. In this example and/or another example, the local memory element may include a plurality of memory cells and the local memory element may be configured to write the multi-bit pixel intensity value into the plurality of memory cells serially. In this example and/or another example, each pixel may define a physical footprint, and each pixel logic hardware module may be sized and aligned to fit within the physical footprint of the corresponding pixel.

In another example, a method for controlling a display device including an array of micro-LEDs that form individual pixels and a plurality of pixel logic hardware modules positioned proximate to corresponding micro-LEDs of the array of micro-LEDs comprises for each micro-LED of the array, during a local update sub-frame of a field time frame designated to visually present an image frame, writing a multi-bit pixel intensity value for the image frame to a local memory element of a pixel logic hardware module corresponding to the micro-LED, and during a pixel modulation sub-frame of the field time frame, driving the micro-LED with a drive signal that is based on the multi-bit pixel intensity value for a pulse width modulation cycle that is repeated at a frequency of at least two pulse modulation cycles per the field time frame. In this example and/or other examples, the local memory element may include a plurality of memory cells and wherein the multi-bit pixel intensity value is written into the plurality of memory cells serially. In this example and/or other examples, the pulse width modulation cycle may be repeated at a frequency of more than two modulation cycles per the field time frame. In this example and/or other examples, the display device may include a plurality of current mirror circuits electrically connected to the array of micro-LEDs, and the method may further comprise adjusting a global intensity of the array of micro-LEDs by adjusting a bias current of the plurality of current mirror circuits. In this example and/or other examples, the display device may include a plurality of current mirror circuits electrically connected to a plurality of different regions of micro-LEDs of the array, and the method may further comprise adjusting a regional intensity of a selected region of micro-LEDs by adjusting a bias current of a current mirror circuit corresponding to the selected region. In this example and/or other examples, the local memory element may include a plurality of memory cells configured to store the multi-bit pixel intensity value and a redundant memory cell, and the method may further comprise 1) determining that a memory cell of the plurality of memory cells is a degraded memory cell, 2) writing a bit of the multi-bit pixel intensity value to the redundant memory cell instead of the degraded memory cell based on said determining.

In yet another example, a display device comprises an array of micro-LEDs forming individual pixels, a plurality of pixel logic hardware modules positioned proximate to corresponding micro-LEDs of the array of micro-LEDs, each pixel logic hardware module including a local memory element configured to store a multi-bit pixel intensity value of a corresponding micro-LED for an image frame, and each pixel logic hardware module being electrically connected to a corresponding micro-LED, and control logic configured to control an intensity of each micro-LED of the array according to a drive scheme that defines a field time frame in which the display device visually presents the image frame, wherein the drive scheme dictates that each micro-LED be driven by a drive signal that is modulated based on the multi-bit pixel intensity value stored in the local memory element corresponding to the micro-LED for a pulse width modulation cycle that is repeated at a frequency of two or more pulse modulation cycles per the field time frame.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device comprising:
a display substrate including an array of micro-LEDs that form individual pixels; and
a backplane substrate including a plurality of pixel logic hardware modules and control logic, each pixel logic hardware module including a local memory element including a plurality of memory cells configured to store a multi-bit pixel intensity value of a corresponding pixel for an image frame and a redundant memory cell, wherein the control logic is configured to 1) determine that a memory cell of the plurality of memory cells is a degraded memory cell and 2) write a bit of the multi-bit pixel intensity value to the redundant memory cell instead of the degraded memory cell based on said determining, and
wherein the backplane substrate is bonded to a backside of the display substrate such that the pixel logic hardware modules are physically aligned behind the array of micro-LEDs, and wherein each pixel logic hardware module is electrically connected to a corresponding micro-LED.

2. The display device of claim 1, wherein the backplane substrate includes control logic configured to individually control an intensity of each micro-LED of the array according to a drive scheme that defines a field time frame in which the display device visually presents the image frame, wherein the drive scheme dictates that a micro-LED be driven by a drive signal that is modulated based on the multi-bit pixel intensity value stored in the local memory element corresponding to the pixel formed by the micro-LED for a pulse width modulation cycle that is repeated at a frequency of at least two modulation cycles per the field time frame.

3. The display device of claim 2, wherein the field time frame includes a local update sub-frame and a modulation sub-frame, wherein during the local update sub-frame the control logic is configured to write the multi-bit pixel intensity value for the image frame to the local memory element, and wherein during the pixel modulation sub-frame the control logic is configured to drive the micro-LED based on the drive signal.

4. The display device of claim 2, wherein the drive scheme dictates that the drive signal is modulated for a pulse width modulation cycle that is repeated at a frequency of more than two cycles per the field time frame.

5. The display device of claim 2, wherein each micro-LED is configured to operate in a current mode in which a change in current of the drive signal causes a linear change in intensity of the micro-LED.

6. The display device of claim 2, wherein the backplane substrate includes a plurality of current mirror circuits electrically connected to the array of micro-LEDs, and wherein the control logic is configured to adjust a global intensity of the array of micro-LEDs by adjusting a bias current of the plurality of current mirror circuits.

7. The display device of claim 2, wherein the backplane substrate includes a plurality of current mirror circuits electrically connected to a plurality of different regions of micro-LEDs of the array, and wherein the control logic is configured to adjust a regional intensity of a selected region of micro-LEDs by adjusting a bias current of a current mirror circuit corresponding to the selected region.

8. The display device of claim 1, wherein the local memory element is a first local memory element, wherein the image frame is a first image frame, and wherein each pixel logic hardware module further includes a second local memory element configured to store a pixel intensity value of a corresponding micro-LED for a second image frame that is visually presented by the display device subsequent to the first image frame.

9. The display device of claim 1, wherein the local memory element includes a static random-access memory (SRAM) element.

10. The display device of claim 9, wherein the SRAM element is configured to store a 12-bit pixel intensity value.

11. The display device of claim 1, wherein the local memory element is configured to write the multi-bit pixel intensity value into the plurality of memory cells serially.

12. The display device of claim 1, wherein each pixel defines a physical footprint, and each pixel logic hardware module is sized and aligned to fit within the physical footprint of the corresponding pixel.

13. A method for controlling a display device including an array of micro-LEDs that form individual pixels and a plurality of pixel logic hardware modules positioned proximate to corresponding micro-LEDs of the array of micro-LEDs, each pixel logic hardware module including a local memory element including a plurality of memory cells and a redundant memory cell, the method comprising:

for each micro-LED of the array, determining if a memory cell of the plurality of memory cells is a degraded memory cell;

based on determining that none of the plurality of memory cells is a degraded memory cell, during a local update sub-frame of a field time frame designated to visually present an image frame, writing a multi-bit pixel intensity value for the image frame to the local memory element of the pixel logic hardware module corresponding to the micro-LED;

based on determining that a memory cell of the plurality of memory cells is a degraded memory cell, during the local update sub-frame of the field time frame designated to visually present the image frame, writing a bit of the multi-bit pixel intensity value to the redundant memory cell instead of the degraded memory cell based on said determining; and during a pixel modulation sub-frame of the field time frame, driving the micro-LED with a drive signal that is based on the multi-bit pixel intensity value for a pulse width modulation cycle that is repeated at a frequency of at least two pulse modulation cycles per the field time frame.

14. The method of claim 13, wherein the multi-bit pixel intensity value is written into the plurality of memory cells serially.

15. The method of claim 13, wherein the pulse width modulation cycle is repeated at a frequency of more than two modulation cycles per the field time frame.

16. The method of claim 13, wherein the display device includes a plurality of current mirror circuits electrically connected to the array of micro-LEDs, and wherein the method further comprises adjusting a global intensity of the array of micro-LEDs by adjusting a bias current of the plurality of current mirror circuits.

17. The method of claim 13, wherein the display device includes a plurality of current mirror circuits electrically connected to a plurality of different regions of micro-LEDs of the array, and wherein the method further comprises adjusting a regional intensity of a selected region of micro-LEDs by adjusting a bias current of a current mirror circuit corresponding to the selected region.

18. A display device comprising:
an array of micro-LEDs forming individual pixels;
a plurality of pixel logic hardware modules positioned proximate to corresponding micro-LEDs of the array of micro-LEDs, each pixel logic hardware module including a first local memory element and a second local memory element, wherein the first local memory element is configured to store a multi-bit pixel intensity value of a corresponding micro-LED for a first image frame, wherein the second local memory element is configured to store a multi-bit intensity value of the corresponding micro-LED for a second image frame that is visually presented by the display device subsequent to the first image frame, and each pixel logic hardware module being electrically connected to a corresponding micro-LED; and
control logic configured to control an intensity of each micro-LED of the array according to a drive scheme that defines a first field time frame in which the display device visually presents the first image frame and a second field time frame in which the display device visually presents the second image frame.

* * * * *